US012672264B2

(12) United States Patent
L'Ecuyer

(10) Patent No.: US 12,672,264 B2
(45) Date of Patent: Jun. 30, 2026

(54) COOLING SYSTEM FOR ELECTRONIC DEVICES

(71) Applicant: Charles L'Ecuyer, Edmonton (CA)

(72) Inventor: Charles L'Ecuyer, Edmonton (CA)

( * ) Notice: Subject to any disclaimer, the term of this patent is extended or adjusted under 35 U.S.C. 154(b) by 215 days.

(21) Appl. No.: 18/566,989

(22) PCT Filed: Jun. 3, 2022

(86) PCT No.: PCT/CA2022/050899
§ 371 (c)(1),
(2) Date: Dec. 4, 2023

(87) PCT Pub. No.: WO2022/251976
PCT Pub. Date: Dec. 8, 2022

(65) Prior Publication Data
US 2024/0276680 A1     Aug. 15, 2024

Related U.S. Application Data

(60) Provisional application No. 63/197,161, filed on Jun. 4, 2021.

(51) Int. Cl.
*H05K 7/20*     (2006.01)
(52) U.S. Cl.
CPC .............................. *H05K 7/20781* (2013.01)
(58) Field of Classification Search
CPC ........... H05K 7/20781; H05K 7/20236; H05K 7/20272; H05K 7/203; H05K 7/20263; H05K 7/20763; H05K 7/20809; H05K 7/20818; H05K 7/20281; H05K 7/20327;
H05K 7/20836; H05K 7/14; H05K 7/20; H05K 7/208; H05K 7/20827; G06F 1/20; G06F 2200/201; G06F 1/206; F28D 1/022; H01L 23/473; H01L 23/34
See application file for complete search history.

(56) References Cited

U.S. PATENT DOCUMENTS

| | | | |
|---|---|---|---|
| 6,813,897 B1 | 11/2004 | Bash et al. | |
| 8,351,206 B2 | 1/2013 | Campbell et al. | |
| 9,219,353 B2 | 12/2015 | Ewing et al. | |
| 9,328,964 B2 * | 5/2016 | Shelnutt | ............. H05K 7/20318 |

(Continued)

OTHER PUBLICATIONS

Low-voltage Direct Current Power-supplying Immersed Liquid-Cooled Artificial Intelligence, Sun et al. CN114860051, PE2E English translation (Year: 2022).*

*Primary Examiner* — Michael A Matey
(74) *Attorney, Agent, or Firm* — Nathan V. Woodruff

(57)     ABSTRACT

A cooling system for cooling electronic devices has a fluid tank with a coolant fluid having a fluid level within the fluid tank, a fluid inlet adjacent to the bottom surface of the fluid tank, and a fluid outlet spaced from the fluid inlet. The fluid inlet and the fluid outlet are in fluid communication through a flow path. A baffle is disposed between the fluid inlet and the fluid outlet. A top of the baffle is below the fluid level of the coolant fluid. A plurality of electronic devices are positioned within the fluid tank, wherein: the plurality of electronic devices are submerged within the coolant fluid; and the plurality of electronic devices engage the baffle to define parallel channels that extend vertically along a portion of the flow path such the coolant fluid cools the plurality of electronic devices.

14 Claims, 6 Drawing Sheets

(56) References Cited

U.S. PATENT DOCUMENTS

| | | | |
|---|---|---|---|
| 10,082,857 B1 | 9/2018 | Czamara et al. | |
| 10,156,987 B1 * | 12/2018 | Gutierrez | G06F 1/3268 |
| 10,405,457 B2 | 9/2019 | Boyd et al. | |
| 11,516,938 B2 | 11/2022 | Nizinkiewicz | |
| 2006/0236292 A1 | 10/2006 | Delp et al. | |
| 2010/0287390 A1 | 11/2010 | Yu | |
| 2011/0132579 A1 * | 6/2011 | Best | H05K 7/20281 |
| | | | 165/104.31 |
| 2012/0024515 A1 | 2/2012 | Wei | |
| 2013/0046410 A1 | 2/2013 | Hsieh et al. | |
| 2014/0201559 A1 | 7/2014 | Chang | |
| 2015/0109730 A1 * | 4/2015 | Campbell | F28D 15/0266 |
| | | | 165/104.27 |
| 2016/0309623 A1 * | 10/2016 | Lei | H05K 7/20927 |
| 2017/0064862 A1 * | 3/2017 | Miyoshi | H01L 23/32 |
| 2017/0265328 A1 * | 9/2017 | Sasaki | H05K 7/20781 |
| 2019/0025894 A1 | 1/2019 | Best et al. | |
| 2019/0090383 A1 | 3/2019 | Tufty et al. | |
| 2019/0317570 A1 * | 10/2019 | Saito | H05K 7/14 |
| 2020/0093024 A1 | 3/2020 | Enright et al. | |
| 2020/0288600 A1 * | 9/2020 | Gao | H05K 7/20272 |
| 2020/0305307 A1 | 9/2020 | Amos et al. | |
| 2020/0333858 A1 * | 10/2020 | Mao | H05K 7/20236 |
| 2022/0225545 A1 * | 7/2022 | Heydari | H05K 7/20736 |
| 2023/0389237 A1 | 11/2023 | L'Ecuyer | |

* cited by examiner

COOLING SYSTEM FOR ELECTRONIC DEVICES

TECHNICAL FIELD

This relates to a cooling system for electronic devices, in particular a cooling systems with a circulating liquid.

BACKGROUND

Servers and other electronic devices are typically cooled by a cooling system during operation to avoid damage and to ensure optimal operating conditions. When multiple devices are operated in the same spaces, such as a server farm or cryptocurrency mining operation, a more robust cooling system may be used. Liquid cooling systems, in which the electronic devices are submerged in a liquid coolant that is circulated through tank, may be used to provide efficient thermal management of the devices. U.S. Pat. No. 10,405,457 (Boyd et al.) entitled "Appliance immersion cooling system" is an example of a liquid cooling system used for electronic devices.

SUMMARY

According to an aspect, there is provided a cooling system for cooling electronic devices. The cooling system comprises a fluid tank comprising a bottom surface, sidewalls, and a coolant fluid having a fluid level within the fluid tank. A fluid inlet is adjacent to the bottom surface of the fluid tank. A fluid outlet is spaced from the fluid inlet, and the fluid inlet and the fluid outlet are in fluid communication through a flow path. A baffle is disposed between the fluid inlet and the fluid outlet and a top of the baffle is below the fluid level of the coolant fluid. A plurality of electronic devices are positioned within the fluid tank, wherein: the plurality of electronic devices is submerged within the coolant fluid; and the plurality of electronic devices engages the baffle to define parallel channels that extend vertically along a portion of the flow path such the coolant fluid cools the plurality of electronic devices.

According to other aspects, the cooling system may comprise one or more of the following features, alone or in combination: the cooling system may further comprise a support structure within the fluid tank that is attached to the baffle and supporting the plurality of electronic devices; the baffle may comprise a stepped cross-section that engages the plurality of electronic devices; the outlet may be positioned above the inlet; the fluid inlet may comprise a manifold with a plurality ports; there may be a heat exchanger connected to receive coolant fluid from the fluid outlet and to supply coolant fluid to the fluid inlet; the plurality of electronic devices may comprise an array of computing units, the array having more than one row and more than one column, wherein a first row of computing units engages the baffle and one or more adjacent rows extend parallel to the first row, and the inlet may comprise a manifold having a plurality of distribution conduits spaced along and extending perpendicular to the baffle; the top of the baffle may be below a top of the plurality of electronic devices; and/or the outlet may be a submerged outlet.

According to an aspect, there is provided a method of cooling a plurality of electronic devices. The method comprising the steps of: inserting the plurality of electronic devices into a fluid tank. The fluid tank comprises a bottom surface, sidewalls, a coolant fluid having a fluid level within the fluid tank; a fluid inlet adjacent to the bottom surface of the fluid tank; a fluid outlet spaced from the fluid inlet, the fluid inlet and the fluid outlet being in fluid communication through a flow path; and a baffle that is disposed between the fluid inlet and the fluid outlet, wherein a top of the baffle is below the fluid level of the coolant fluid. The plurality of electronic devices are inserted such that the plurality of electronic devices is positioned below the fluid level such that the plurality of electronic devices is submerged within the coolant fluid. The plurality of electronic devices engages the baffle to define parallel channels that extend vertically along a portion of the flow path. The coolant fluid is circulated along the flow path to cool the plurality of electronic devices.

According to other aspects, the method may further comprise one or more of the following features, alone or in combination: the method may further comprise the step of cooling the coolant fluid by circulating the coolant fluid through a heat exchanger outside the fluid tank; the method may further comprise the step of supporting the plurality of electronics with a support structure; the baffle may comprise a stepped cross section that engages the plurality of electronic devices; the outlet may be positioned above the inlet; the fluid inlet may comprise a manifold with a plurality of ports; the plurality of electronic devices may comprise an array of computing units, the array having more than one row and more the one column; the method may further comprise the step of engaging a first row of computing units to the baffle; the top of the baffle may be below a top of the plurality of electronic devices; and the outlet may be a submerged outlet.

Other aspects and features will be apparent from the description and drawings.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION OF PREFERRED EMBODIMENTS

Figure 1:
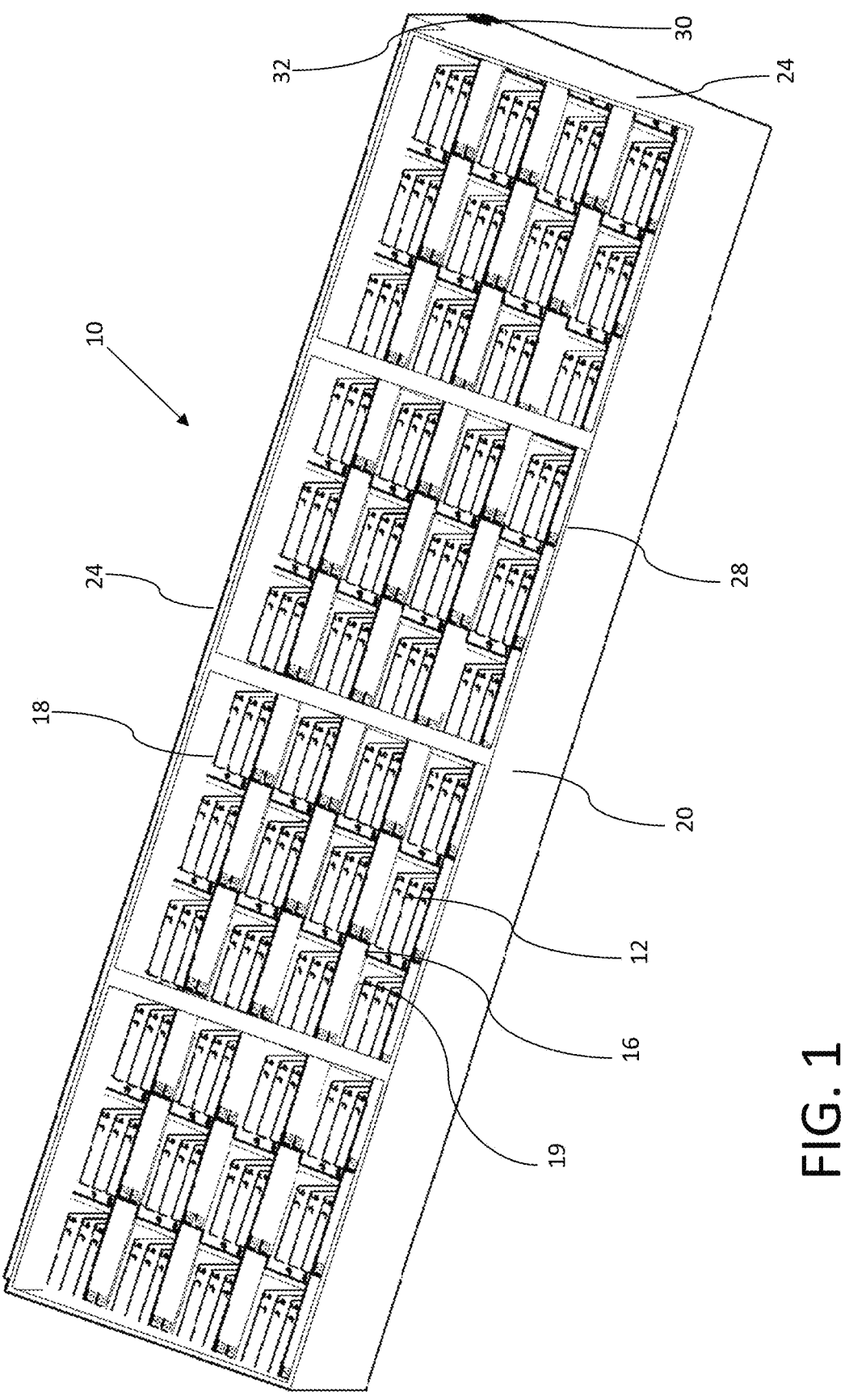
FIG. 1 is a perspective view of a cooling system.
Figure 2:
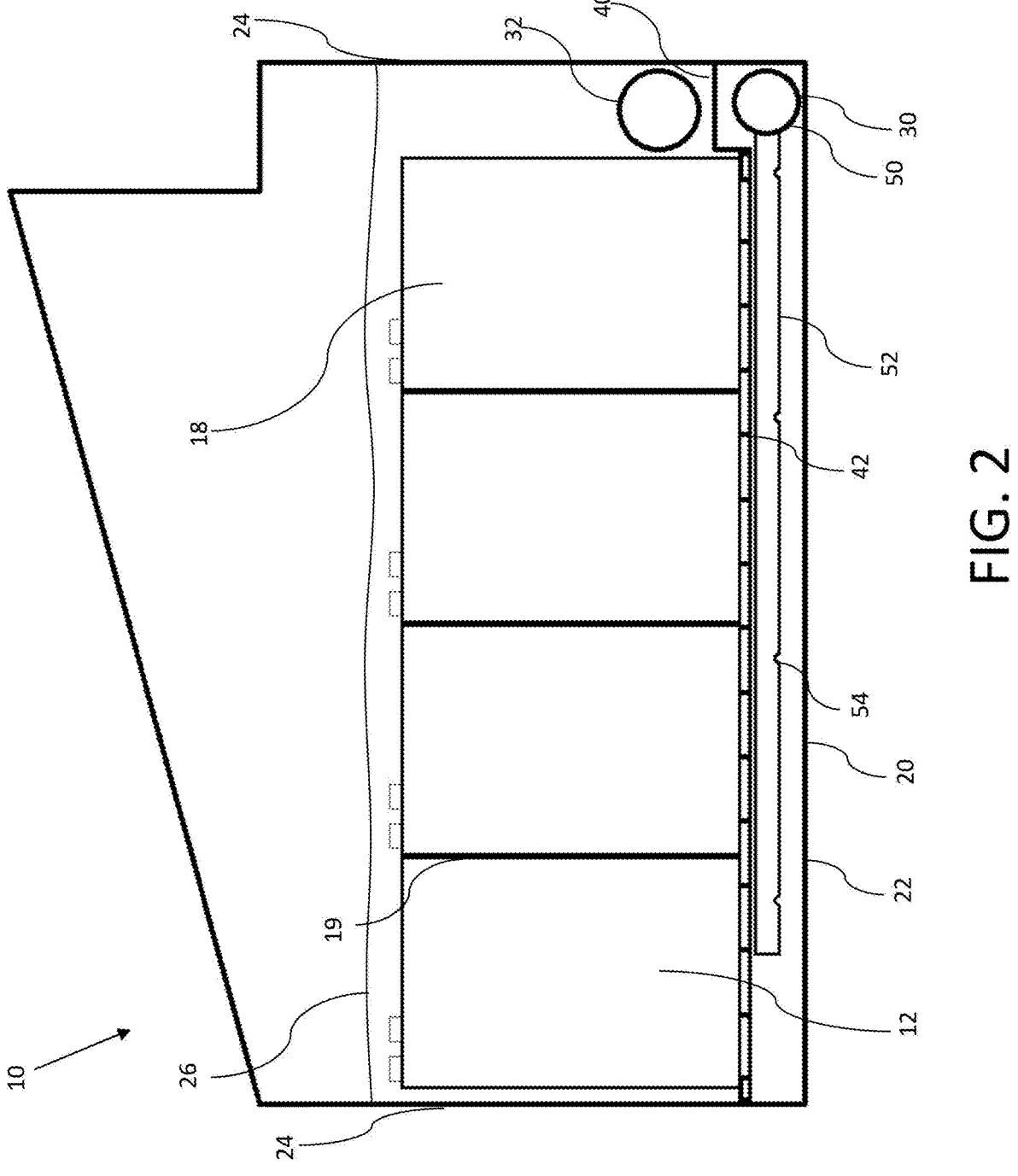
FIG. 2 is an end elevation view of a cooling system.

A cooling system, generally identified by reference numeral 10, will now be described with reference to FIG. 1 through 6.

Referring to FIG. 1, cooling system 10 is used to cool electronic devices 12, typically arranged in an array 16, using a coolant fluid 14. Electronic devices 12 may be any type of electronics that generates heat and requires cooling. Common types electronic devices that may be cooled include servers and processors used in server farms, cryptocurrency mining, etc. Various types of suitable coolant fluid 14 are commercially available, and an appropriate fluid may be selected based on the specifications of the tank and array of devices to be cooled.

Figure 4:
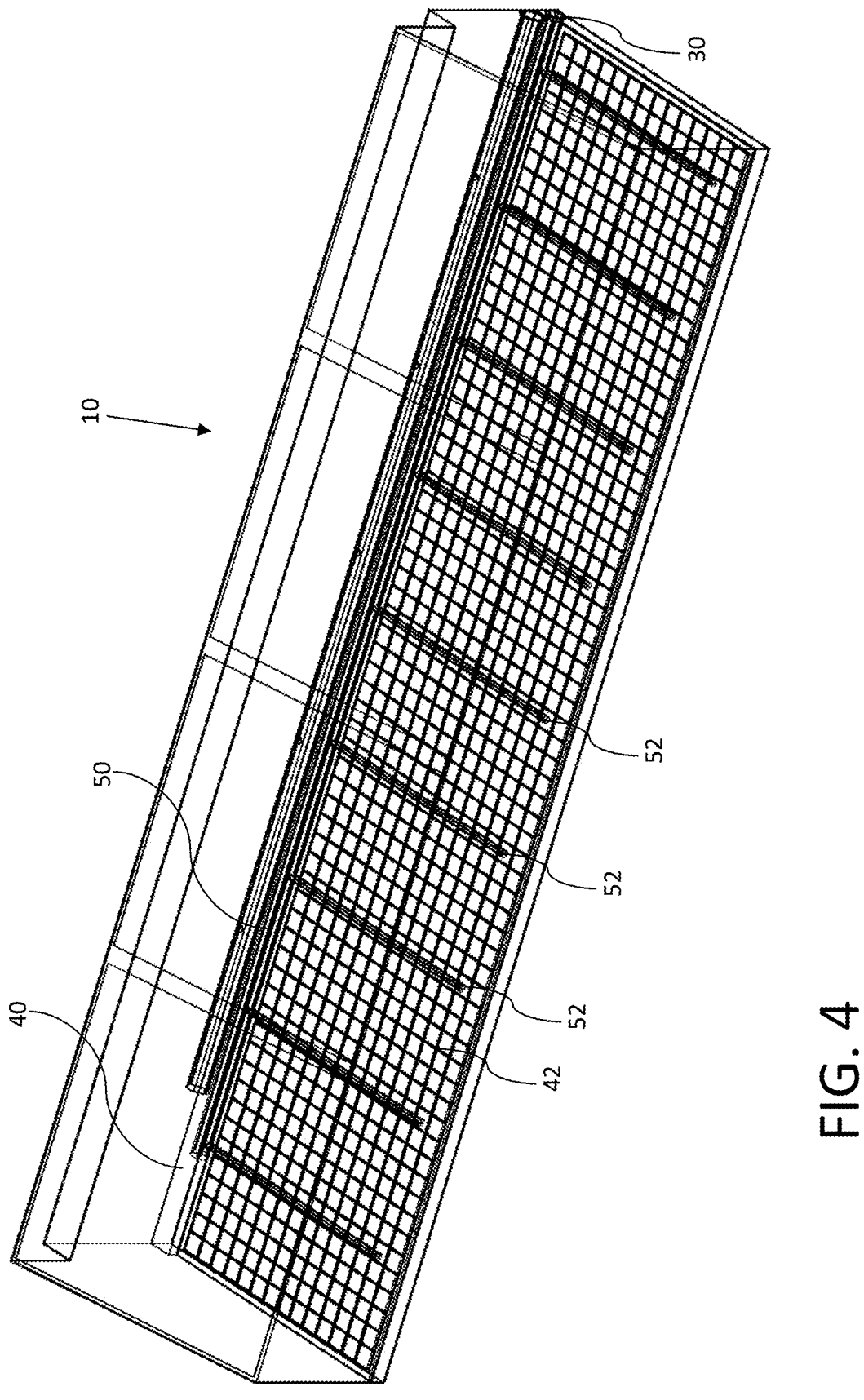
FIG. 4 is a perspective view of a fluid tank for a cooling system.

Referring to FIG. 4, cooling system 10 has a fluid tank 20 with a bottom surface 22, sidewalls 24, and an open top 28.

Fluid tank 20 is filled with coolant fluid 14. The fluid level 26 within fluid tank 20 will depend on the structures within tanks 20 and the size of electronic devices 12 and is preferably selected to immerse electronic devices 12, either entirely or sufficiently to allow for sufficient cooling and circulation past electronic devices 12. Opening 28 in the top of fluid tank 20 is sufficiently large to allow electronic devices 12 to be inserted or removed from fluid tank 20 and may be accessed by a lid or covering (not shown). A fluid inlet 30 is positioned adjacent to bottom surface 22, and a fluid outlet 32 is spaced from the fluid inlet 30 and is in fluid communication with fluid inlet 30 through a flow path 34. As will be understood, fluid inlet 30 and fluid outlet 32 is defined primarily by the location of the flow ports, and not the conduit that conducts the fluid toward or away from the flow ports. Various designs of fluid inlet 30 may be used that introduce fluid adjacent to bottom of tank 20 (i.e. below the electronic devices 12 within tank 20) and withdraw fluid from tank 20 below the fluid level of tank 20. Fluid inlet 30 is in fluid communication with the bottom of tank 20, and fluid outlet 32 is in fluid communication with fluid at the top of tank 20. As such, fluid outlet 32 may be positioned above fluid inlet 30, where having fluid inlet 30 and fluid outlet 32 vertically spaced and/or aligned may improve efficient use of space within tank 20. Both fluid inlet 30 and fluid outlet 32 are submerged, such that the fluid level within tank 20 is defined by the amount of fluid in tank 20 along with other submerged components. A baffle 40 is positioned between fluid inlet 30 and fluid outlet 32 and extends along a length of fluid tank 20. A support structure 42 for supporting electronic devices 12 may be positioned within fluid tank 20. As shown, support structure 42 may be attached to baffle 40, however it will be understood that support structure 42 may have other forms suitable for supporting electronic devices 12 in a specific location within fluid tank 20 and allowing fluid flow through support structure 42, as will be discussed below. As shown, support structure 42 is a grid with openings large enough to minimize flow restrictions to an acceptable level.

Figure 3:
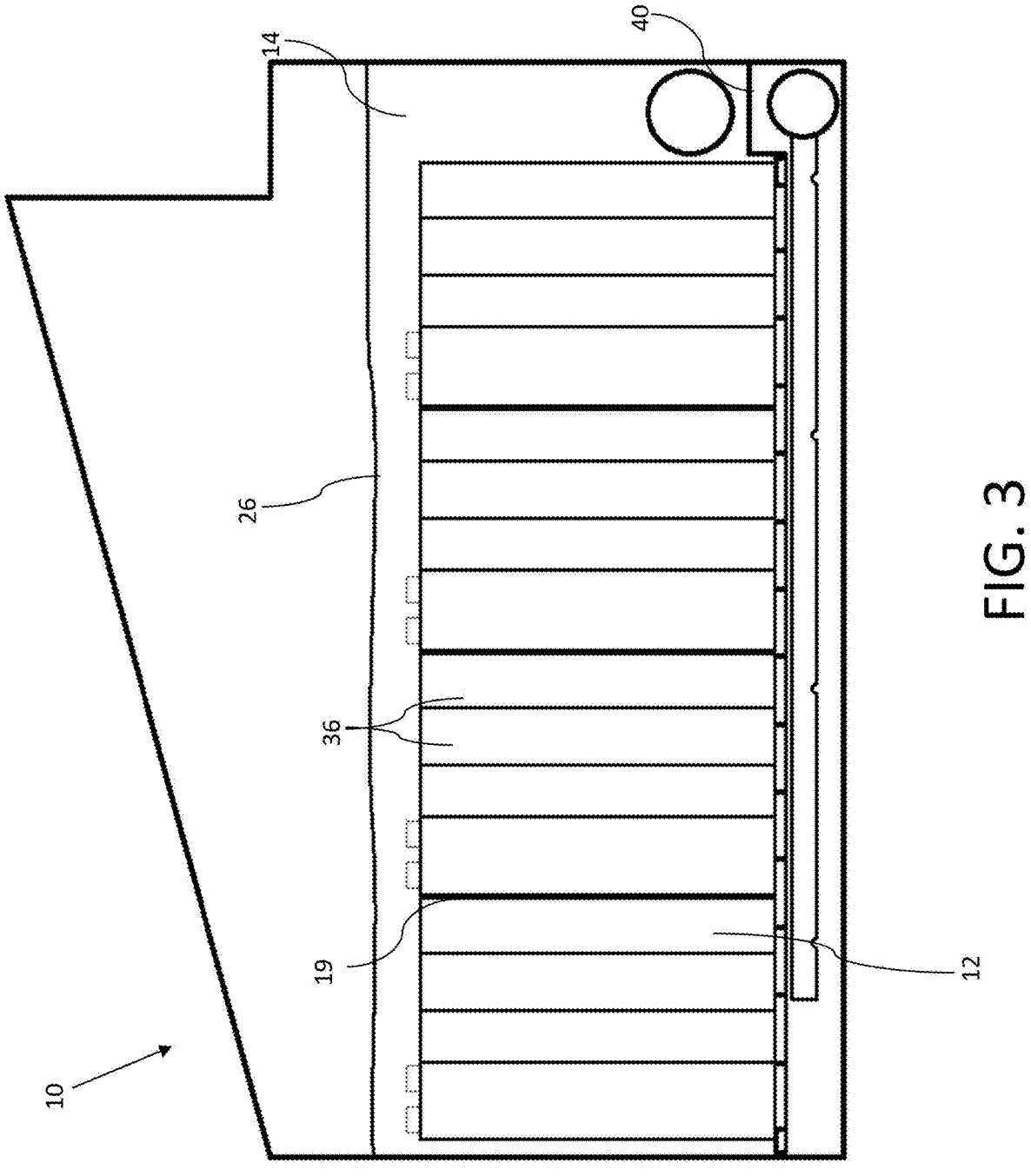
FIG. 3 is an end elevation view of a cooling system.

Referring to FIG. 3, electronic devices 12 are positioned below fluid level 26 such that electronic devices 12 are submerged within the coolant fluid. It will be understood that electronic devices 12 includes the heat producing elements, such as power supplies, and processing units typically mounted on printed circuit boards, and that there may be various connections to electronic devices that extend above fluid level 26 and are not necessarily submerged. Electronic devices 12 engage baffle 40 to define parallel channels 36 that extend vertically along a portion of flow path 34 such that coolant fluid 14 flowing through parallel channels 36 cools electronic devices 12. Heat producing components within parallel channels 36 are thermally exposed to coolant fluid 14; this may include being directly exposed to cooling fluid 14 or being attached to thermally conductive heat spreaders or heat sinks that are exposed to the flow of cooling fluid 14. Baffle 40 may have a stepped cross-section that engages electronic devices 12 to increase an amount of contact surface and prevent fluid from flowing between electronic devices 12 and baffle 40. Baffle 40 may cooperate with electronic devices 12 to define and extend the flow path 34 of coolant fluid 14. Baffle 40, which may have various sizes and shapes, is preferably submerged below the fluid level of coolant fluid 14 such that baffle directs the flow path of coolant fluid through tank 20, but does not define the fluid level within tank 20. Preferably, baffle 40 is below a top of electronic devices 12, where the height of the flow path within tank 20 is define by the top of electronic devices 12.

In the depicted embodiment, baffle 40 has a lateral portion that extends out from sidewall 24 of tank 20 between fluid inlet 30 and fluid outlet 32, which are spaced vertically within tank 20, and defines a shoulder that engages a bottom portion of electronic devices 12 to prevent fluid from diverting around electronic devices 12. Similarly, in some cases, if tank 20 is not entirely filled with electronic devices 12, blanks or temporary dams may be inserted to ensure the desired flow of fluid through tank 20 is maintained. Referring to FIG. 1, electronic devices 12 may be in an array 16 of at least one row and multiple columns. Rows and columns of array 16 are defined as extending along baffle 40 or away from baffle 40, respectively, and may not be orthogonal. Row 18 of electronic devices, or row 18 that is closest to baffle 40 if there are multiple rows, engages baffle 40 and one or more adjacent rows extend parallel to row 18. Electronic devices 12 may also be stacked vertically, such that array 16 is a three-dimensional array.

Electronic devices 12 are disposed between fluid inlet 30 and fluid outlet [30] 32 along the flow path such that fluid flows along parallel flow channels 36 defined by electronic devices 12 that are part of the flow path through tank 20. Channels 36 may be defined by electronic devices 12, casings 19 that house electronic devices 12, components within casings 19, or combinations thereof. Casings 19 may be rectangular or square in cross-section and may be designed to connect or interlock with adjacent casings 19. Tanks 20 may be designed to receive different styles of casings 19 or electronic devices 12.

Cooling system 10 is configured such that cooled cooling fluid 14 flows into fluid tank 20 through fluid inlet 30, along channels 36, and then exits fluid tank 20 through outlet 32. The flow path through tank 20 may be extended by electronic devices 12, where row 18, when installed against baffle 40, acts as a vertical baffle that restricts the flow of fluid to outlet 32 until fluid passes over the top of electronic devices 12.

Figure 6:
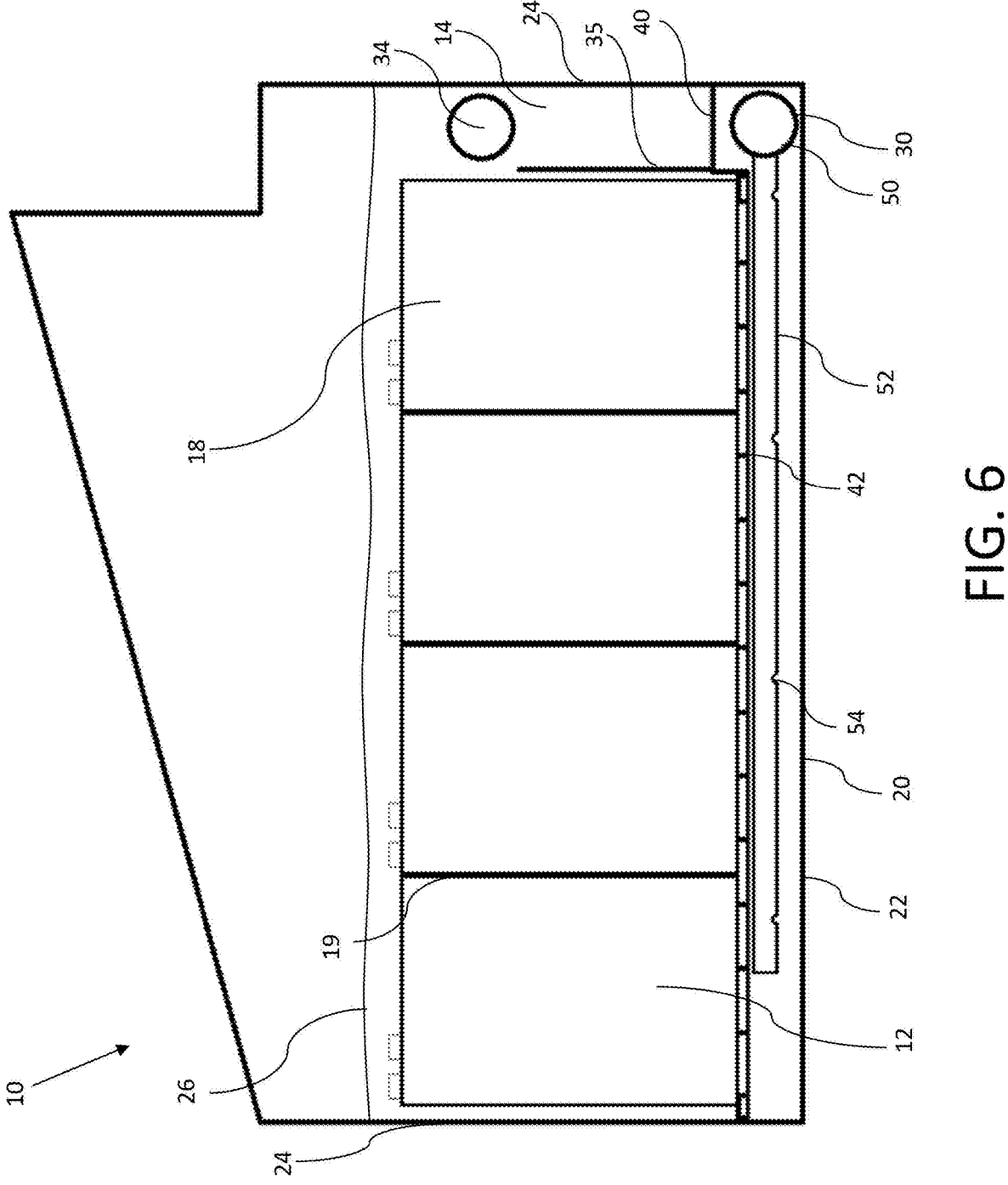
FIG. 6 is an end elevation view of an alternative cooling system

Preferably, fluid inlet 30 is designed to distribute fluid along the bottom of tank 20 to provide substantially even cooling throughout tank 20 and avoid or reduce heated fluid "deadspots" within tank 20. In one example, referring to FIG. 4, fluid inlet 30 may be an inlet manifold 50 with distribution conduits 52 spaced along and extending perpendicular to baffle 40. Inlet manifold 50 may have ports 54 that distribute cooling fluid 14 adjacent to bottom surface 22 of fluid tank 20. Fluid outlet 32 may be located above baffle 40 within a fluid exit channel 38 that is defined by first row 18, sidewall 24, and baffle 40. Fluid outlet 32 may be an elongate conduit with multiple ports that withdraws fluid from tank 20. As will be understood, the size and shape of inlet 30 and outlet 32 may be scaled to achieve a more even flow along the length of tank 20. Referring to FIG. 6, fluid outlet 32 may be at different elevations between fluid level 26 and fluid inlet 30. Tank 20 may also include an additional baffle 35 that is submerged within coolant fluid 14 and below fluid level 26. Baffle 35 may be oriented vertically and may be used as a guide to help during the installation of electronic devices 12. Baffle 35 may be considered an extension of baffle 40 and may be mounted thereto Baffle 35 may help reduce the likelihood of a "short circuit" of coolant fluid between fluid inlet 30 and fluid outlet 32, such that coolant fluid 14 is encouraged to flow between electronic devices 12.

Figure 5:
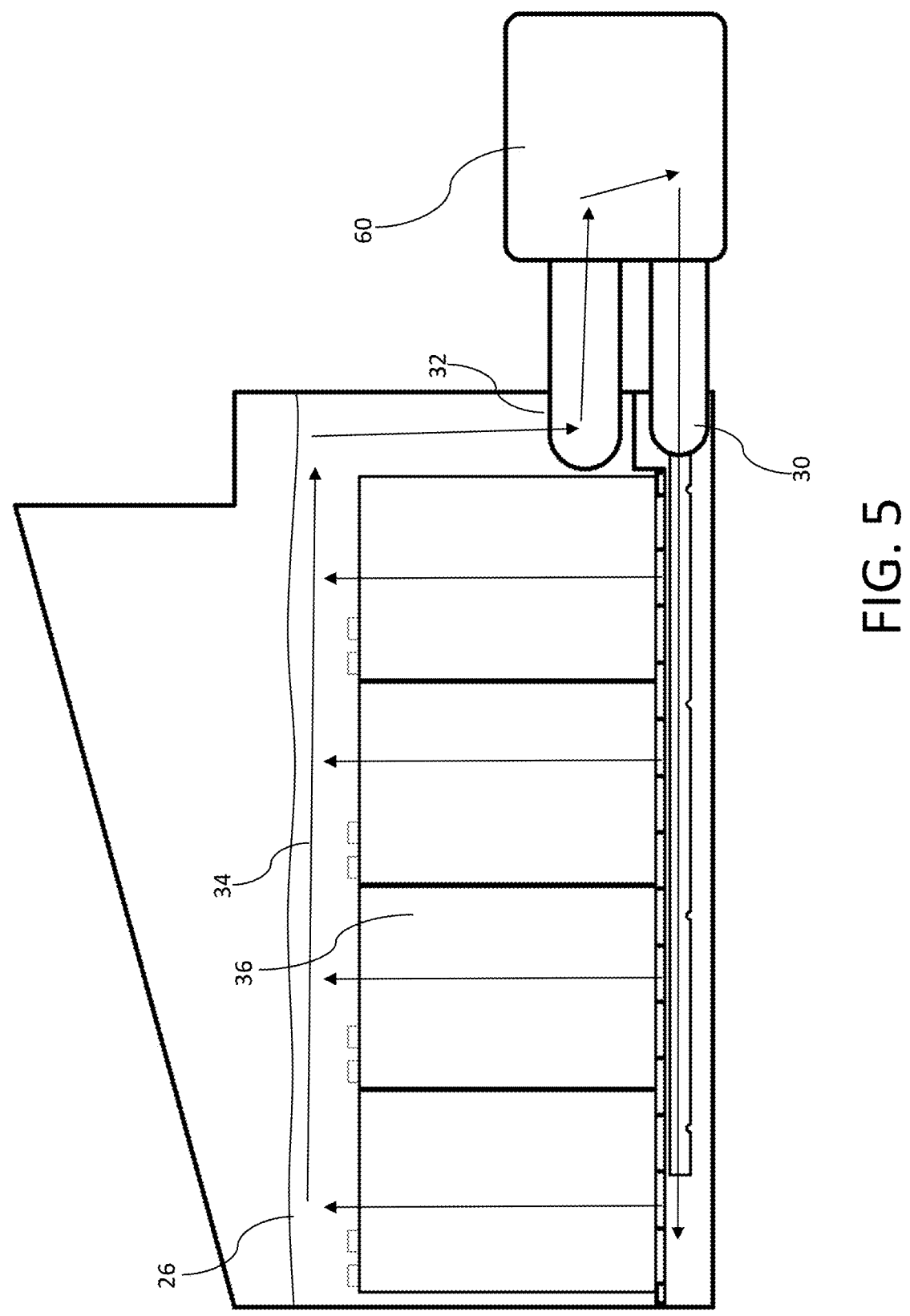
FIG. 5 is an end elevation view of a cooling system.

Referring to FIG. 5, coolant fluid 14 may flow in a closed loop through a heat exchanger 60, such as a fan-cooled radiator, a refrigerated heat exchanger, etc. connected to receive coolant fluid 14 from fluid outlet 32, remove excess heat, and return coolant fluid 14 at a lower temperature to fluid inlet 30. Coolant fluid 14 may also be cooled in other ways, such as in an open loop system that uses a coolant fluid storage tank (not shown).

A method of cooling electronic devices 12 using cooling system 10 will now be described.

Electronic devices 12 are inserted into fluid tank 20 that is filled with coolant fluid 14 to fluid level 26. Electronic devices 12 may be inserted individually or in a group and may be secured to adjacent devices. First row 18 engages baffle 40 to define a portion of the flow path through or adjacent to electronic devices 12 such that they are cooled as fluid circulates through tank 20. As shown, Baffle 40 may include a shoulder on which one edge of electronic devices 12 in row 18 rests, and prevents fluid from "short circuiting" the flow path from inlet 30 to outlet 32.

With electronic devices 12 submerged within coolant fluid 14, coolant fluid 14 is circulated along the flow path 34 to cool electronic devices 12. As coolant fluid 14 is circulated through flow path 34 it first enters through fluid inlet 30, where it may be distributed within fluid tank 20 by an inlet manifold. Coolant fluid 14 passes upwards through parallel channels 36 where heat producing components of electronic devices 12 are cooled by coolant fluid 14. Coolant fluid flows out of the top of parallel channels 36 and into fluid outlet 32, where it may be circulated through a heat exchanger 60 located outside of fluid tank 20, and back into fluid inlet 30.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

What is claimed is:

1. A cooling system for cooling electronic devices, the cooling system comprising:

a fluid tank comprising a bottom surface, sidewalls, and a coolant fluid having a fluid level within the fluid tank;

a support structure above the bottom surface of the fluid tank;

a fluid inlet adjacent to the bottom surface of the fluid tank, the fluid inlet comprising a plurality of distribution conduits extending along the bottom surface of the fluid tank, the plurality of distribution conduits defining an array of apertures that are adapted to introduce coolant fluid adjacent to the bottom surface of the fluid tank, the array of apertures being spaced below the support structure;

a fluid outlet spaced from the fluid inlet, the fluid outlet comprising an elongated conduit disposed within the fluid tank and submerged within the coolant fluid, the elongated conduit comprising a series of fluid ports spaced along a length of the fluid tank to withdraw fluid from the fluid tank, the fluid inlet and the fluid outlet being in fluid communication through a flow path;

a baffle that is disposed between the fluid inlet and the fluid outlet, a top of the baffle being below the fluid level of the coolant fluid; and a plurality of electronic devices positioned within the fluid tank, the plurality of electronic devices being supported by the support structure such that:

the plurality of electronic devices are submerged within the coolant fluid; and the plurality of electronic devices engage the baffle to define parallel channels that extend vertically along a portion of the flow path such the coolant fluid cools the plurality of electronic devices.

2. The cooling system of claim 1, wherein the baffle comprises a stepped cross-section that engages the plurality of electronic devices.

3. The cooling system of claim 1, wherein the fluid outlet is positioned above the fluid inlet.

4. The cooling system of claim 1, further comprising a heat exchanger connected to receive coolant fluid from the fluid outlet and to supply coolant fluid to the fluid inlet.

5. The cooling system of claim 1, wherein the plurality of electronic devices comprise an array of computing units, the array having more than one row and more than one column, wherein a first row of computing units engages the baffle and one or more adjacent rows extend parallel to the first row.

6. The cooling system of claim 5, wherein the plurality of distribution conduits extend perpendicular to the baffle.

7. The cooling system of claim 1, wherein the top of the baffle is below a top of the plurality of electronic devices.

8. A method of cooling a plurality of electronic devices, the method comprising the steps of:

inserting the plurality of electronic devices into a fluid tank that comprises:

a bottom surface, sidewalls, and a coolant fluid having a fluid level within the fluid tank;

a support structure above the bottom surface of the fluid tank;

a fluid inlet adjacent to the bottom surface of the fluid tank, wherein the fluid inlet comprises a manifold having a plurality of distribution conduits spaced along and extending perpendicular to the baffle that are positioned to introduce coolant fluid adjacent to the bottom surface of the fluid tank;

a fluid outlet spaced from the fluid inlet, the fluid outlet comprising an elongated conduit disposed within the fluid tank and submerged within the coolant fluid, the elongated conduit comprising a series of fluid ports spaced along a length of the fluid tank to withdraw fluid from the fluid tank, the fluid inlet and the fluid outlet being in fluid communication through a flow path; and a baffle that is disposed between the fluid inlet and the fluid outlet, wherein a top of the baffle is below the fluid level of the coolant fluid;

the plurality of electronic devices being inserted such that:

the plurality of electronic devices are positioned below the fluid level such that the plurality of electronic devices are submerged within the coolant fluid; and the plurality of electronic devices engage the baffle to define parallel channels that extend vertically along a portion of the flow path;

and circulating the coolant fluid along the flow path to cool the plurality of electronic devices.

9. The method of claim 8, further comprising the step of cooling the coolant fluid by circulating the coolant fluid through a heat exchanger outside the fluid tank.

10. The method of claim 8, wherein the baffle comprises a stepped cross section that engages the plurality of electronic devices.

11. The method of claim 8, wherein the fluid outlet is positioned above the fluid inlet.

12. The method of claim 8, wherein the plurality of electronic devices comprise an array of computing units, the array having more than one row and more the one column.

13. The method of claim 8, further comprising the step of engaging a first row of computing units to the baffle.

14. The method of claim 8, wherein the top of the baffle is below a top of the plurality of electronic devices.

* * * * *